United States Patent [19]

Nakano et al.

[11] Patent Number: 4,484,312
[45] Date of Patent: Nov. 20, 1984

[54] DYNAMIC RANDOM ACCESS MEMORY DEVICE

[75] Inventors: Tomio Nakano; Masao Nakano, both of Kawasaki; Yoshihiro Takemae, Yokohama; Norihisa Tsuge, Kamakura; Tsuyoshi Ohira, Yokohama, all of Japan

[73] Assignee: Fujitsu Limited, Kawasaki, Japan

[21] Appl. No.: 392,077

[22] Filed: Jun. 25, 1982

[30] Foreign Application Priority Data

Jun. 29, 1981 [JP] Japan .................... 56-99753

[51] Int. Cl.³ .................... G11C 11/40
[52] U.S. Cl. .................... 365/233; 365/189
[58] Field of Search .................... 365/189, 230, 233

[56] References Cited

U.S. PATENT DOCUMENTS 4,419,739 12/1983 Blum .................... 365/233

OTHER PUBLICATIONS

IEEE Journal of Solid-State Circuits, "A 64 kbit MOS Dynamic RAM with Novel Memory Capacitor", by Smith et al., vol. SC-15, No. 2, Apr. 1980, pp. 184–189.

Primary Examiner—Terrell W. Fears
Attorney, Agent, or Firm—Staas & Halsey

[57] ABSTRACT

A dynamic random access memory device which comprises one-transistor, one-capacitor-type memory cells ($C_{00} \sim C_{127,127}$) in rows and columns and dummy cells ($DC_{20}' \sim DC_{2,127}'$, $DC_{20}'' \sim DC_{2,127}''$, $DC_{20}''' \sim DC_{2,127}'''$) in rows. The capacitors ($C_d$) of the dummy cells are charged to a high power supply potential ($V_{CC}$) by one or more charging transistors ($Q_A$ or $Q_A'$) clocked by a reset clock signal ($\phi_R$). The capacitors ($C_d$) of the dummy cells are discharged to a low power supply potential ($V_{SS}$) by one or more transistors ($Q_B$ or $Q_B'$) clocked by an operation clock signal ($\phi_{WL}$) having a potential lower than the high power supply potential ($V_{CC}$).

12 Claims, 12 Drawing Figures

DYNAMIC RANDOM ACCESS MEMORY DEVICE

BACKGROUND OF THE INVENTION

1. Field of the Invention

The present invention relates to a semiconductor device, more particularly, to a dynamic random access memory (RAM) device comprising one-transistor, one-capacitor-type memory cells.

2. Description of the Prior Art

In a MOS dynamic RAM device, one-transistor, one-capacitor-type memory cells have been put to practical use, and, in addition, such memory cells are often used since they are advantageous in respect to integration density. In this type of memory cell, each cell comprises a capacitor and a transistor which serves as a switching element for charging and discharging the capacitor. Therefore, the presence or absence of charges in the capacitor represents data "1" or "0", respectively. The memory cells are arranged at intersections between word lines and bit lines. In addition, dummy cells are arranged at intersections between dummy word lines and bit lines.

In the prior art, these dummy cells are similar in construction to the one-transistor, one-capacitor-type memory cells in that they comprise a capacitor, a transistor, and an additional transistor for resetting the capacitor. However, in recent years, dummy cells comprising only one capacitor have been developed (See: IEEE Journal of Solid-State Circuits, vol. SC-15, No. 2, pp. 184–189, April 1980). A dynamic RAM including such one-capacitor dummy cells is advantageous in respect to integration density and reduces the load of the operation clock generator.

In a dynamic RAM device including the above-mentioned one-capacitor-type dummy cells, a discharging transistor and a charging transistor are provided in series between two power supplies ($V_{CC}$, $V_{SS}$), and their connection node is connected to a dummy word line connected to the dummy cells. The control of this device is carried out as follows. First, the dummy word line is discharged by the discharging transistor clocked by a reset clock generator. In this state, the dummy word line is at level $V_{SS}$. Then, the dummy word line is charged by the charging transistor clocked by an operation clock generator so that the potential of the dummy word line is pushed up to the power supply voltage ($V_{CC}$).

In the above-mentioned dynamic RAM device, however, in order to push up the potential of the dummy word line, the operation clock generator must generate a potential higher than $V_{CC}+V_{th}$, where $V_{th}$ is the threshold voltage value of the charging transistor. As a result, the operation clock generator has to incorporate a charge-pumping circuit or a bootstrap circuit for generating such a higher potential. Therefore, the operation clock generator becomes complex, and, accordingly, the operation speed of the operation clock generator, that is, the access speed of the device, becomes low.

SUMMARY OF THE INVENTION

It is, therefore, a principle object of the present invention to provide a dynamic RAM device comprising one-transistor, one-capacitor-type memory cells in which the access speed is high.

It is another object of the present invention to provide a dynamic RAM device comprising one-transistor, one-capacitor-type memory cells in which correct data can be read out even if a fluctuation in the power supply voltage is generated.

According to the present invention, there is provided a dynamic RAM device; first and second power supplies, the potential of the first power supply being lower than that of the second power supply; a first clock generator for generating a first clock signal having a potential higher than that of the second power supply and a second clock signal having a potential lower than or equal to the potential of the second power supply; a second clock generator for generating a third clock signal having a potential higher than the potential of the second power supply alternately with the first and second clock signals; a plurality of word lines selectively driven by the first clock signal; a plurality of pairs of bit lines precharged by the second power supply in response to the third clock signal; a plurality of sense amplifiers, each sense amplifier being arranged between one pair of the pairs of bit lines, for sensing the difference in potential between the pairs of bit lines; a plurality of one-transistor, one-capacitor-type memory cells in rows and columns, each memory cell being connected to one of the word lines and to one of the bit lines; a plurality of dummy cells, each dummy cell comprising a capacitor and a connection node, the capacitor having an electrode connected to one of the bit lines and another electrode connected to one of the connection nodes; at least one charging means, each means being connected to each of the connection nodes of the dummy cells respectively and driven by the third clock generator, for charging the capacitor of each of the dummy cells; and at least one discharging means, each means being connected to each of the connection nodes of the dummy cells respectively and driven by the second clock signal, for discharging the capacitor of each of the dummy cells.

BRIEF DESCRIPTION OF THE DRAWINGS

The present invention will be more clearly understood from the description as set forth below contrasting the present invention with the prior art and referring to the accompanying drawings, wherein.

DESCRIPTION OF THE PREFERRED EMBODIMENTS

Figure 1:
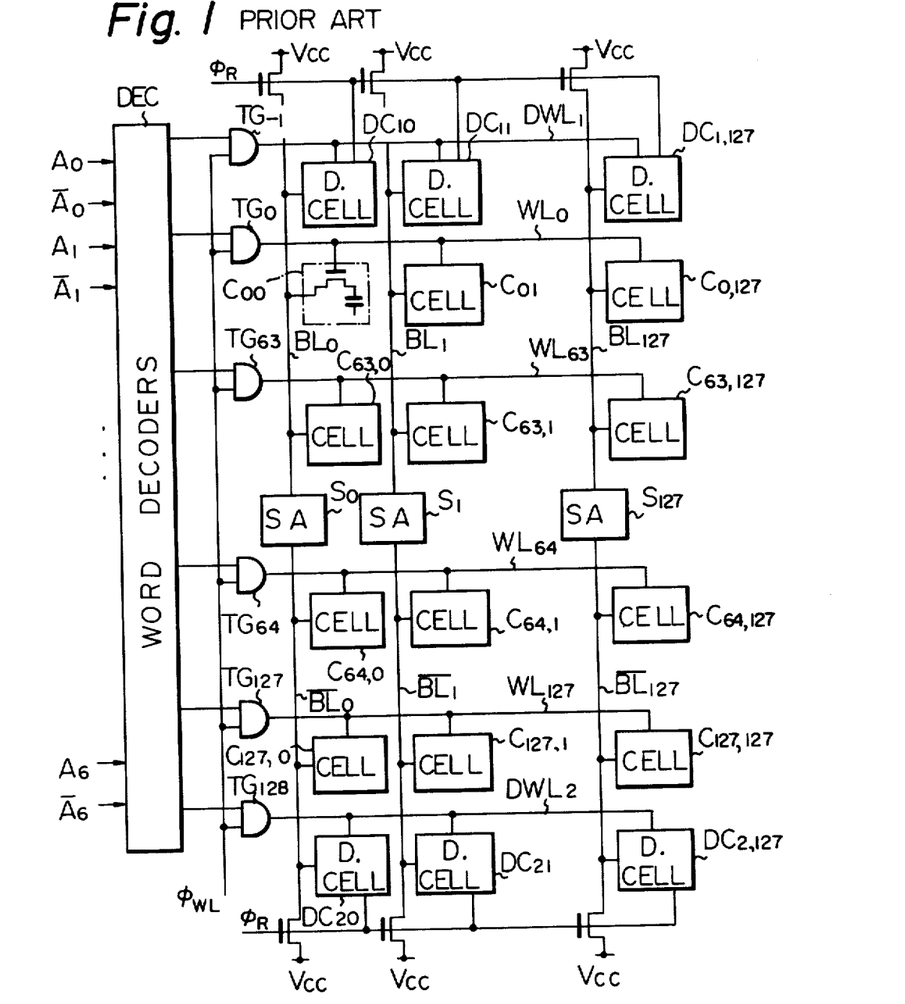
FIG. 1 is a block circuit diagram of a prior art dynamic RAM device.

First, the prior art dynamic RAM devices will be explained with reference to FIGS. 1, 2, 3, 4A, and 4B. In FIG. 1, for example, a 16 kbit (precisely, 16,384 bit) RAM device is illustrated. In the figure, one-transistor, one-capacitor-type memory cells $C_{00}$, $C_{01}$, ..., $C_{0,127}$, $C_{63,0}$, $C_{63,1}$, ..., $C_{63,127}$, $C_{64,0}$, $C_{64,1}$, ..., $C_{64,127}$, $C_{127,0}$, $C_{127,1}$, ..., and $C_{127,127}$ in rows and columns are arranged at intersections between word lines $WL_0$, ..., $WL_{63}$, $WL_{64}$, ..., and $WL_{127}$ and bit lines $BL_0$, $\overline{BL}_0$, $BL_1$, $\overline{BL}_1$, ..., $BL_{127}$, and $\overline{BL}_{127}$, and sense amplifiers $S_0$, $S_1$, ..., and $S_{127}$ in a row are arranged between bit line pairs $BL_0$, $\overline{BL}_0$, $BL_1$, $\overline{BL}_1$, ..., $BL_{127}$, and $\overline{BL}_{127}$. Further, dummy cells $DC_{10}$, $DC_{11}$, ..., and $DC_{1,127}$ in a row are connected to the terminals of bit lines $BL_0$, $BL_1$, ..., and $BL_{127}$ and to dummy word line $DWL_1$ while dummy cells $DC_{20}$, $DC_{21}$, ..., and $DC_{2,127}$ in a row are connected to the terminals of bit lines $\overline{BL}_0$, $\overline{BL}_1$, ..., and $\overline{BL}_{127}$ and to dummy word line $DWL_2$.

In FIG. 1, $\phi_{WL}$ is an operation clock signal for driving word lines $WL_0$, ..., $WL_{63}$, $WL_{64}$, ..., and $WL_{127}$ and dummy word lines $DWL_1$ and $DWL_2$. $\phi_R$ is a reset clock signal for resetting capacitor $Q_R$ (not shown in FIG. 1 but shown in FIG. 2) of each dummy cell and for precharging bit lines $BL_0$, $\overline{BL}_0$, $BL_1$, E,ovs/BL/ $_1$, ..., $BL_{127}$ and $\overline{BL}_{127}$.

The selection of word lines $WL_0$, $WL_1$, ..., and $WL_{127}$ is carried out by word decoders DEC, and, simultaneously, the selection of dummy word lines $DWL_1$ and $DWL_2$ is also carried out by row decoders DEC. For example, when one of the word lines $WL_0$ through $WL_{63}$ is selected, dummy word line $DWL_2$ is selected while when one of word lines $WL_{64}$ through $WL_{127}$ is selected, dummy word line $DWL_1$ is selected. Such selection is carried out by transfer gates $TG_{-1}$, $TG_0$, ..., $TG_{63}$, $TG_{64}$, ..., $TG_{127}$, and $TH_{128}$ which are switched on by word decoders DEC so as to transfer the clock signal $\phi_{WL}$. In more detail, word decoders DEC decode row address signals $A_0$, $\overline{A}_0$, $A_1$, $\overline{A}_1$, ..., $A_5$ and $\overline{A}_5$ so that one of the transfer gates $TG_0$ through $TG_{127}$, that is, one of the word lines $WL_0$ through $WL_{127}$, is selected, and, in addition, row decoders DEC decode row address signal $A_6$ or $\overline{A}_6$ so that one of the transfer gates $TG_{-1}$ and $TG_{128}$, that is, one of the dummy word lines $DWL_1$ and $DWL_2$, is selected.

Figure 2:
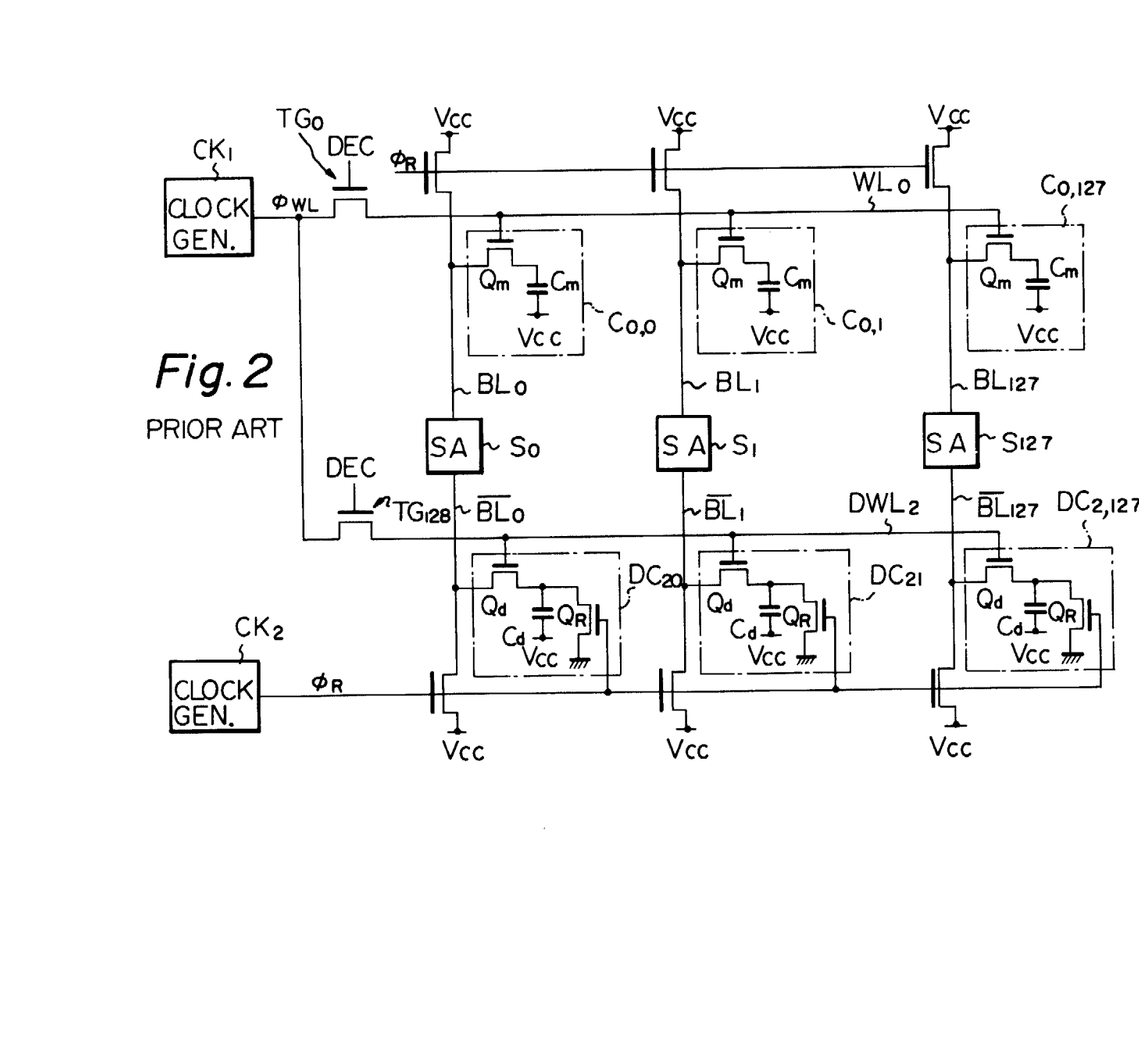
FIG. 2 is a partial circuit diagram of the circuit of FIG. 1.

In FIG. 2, which is a partial circuit diagram of the circuit of FIG. 1, word line $WL_0$ and dummy word line $DWL_2$ of FIG. 1 are illustrated in detail while the other word lines and dummy word line $DWL_1$ are omitted. That is, if word line $WL_0$ is selected, dummy word line $DWL_2$ on the opposite side regarding the sense amplifiers is always selected.

Each of memory cells $C_{00}$, $C_{01}$, ..., and $C_{0,127}$ comprises capacitor $C_m$ and transistor $Q_m$ while each of the dummy cells $DC_{20}$, $DC_{21}$, ..., and $DC_{2,127}$ comprises capacitor $C_d$, transistor $Q_d$, and transistor $Q_R$. In this case, the capacitance of each capacitor $C_d$ of the dummy memory cells is set to be about half the capacitance of each capacitor $C_m$ of the memory cells. During the standby mode, reset clock generator $CK_2$ generates reset clock signal $\phi_R$ having a potential higher than $V_{CC}+V_{th}$, where $V_{th}$ is the common threshold voltage value of the enhancement transistors. As a result, capacitors $C_d$ of the dummy cells $D_{20}$, $D_{21}$, ..., and $DC_{2,127}$ are discharged, and, simultaneously, bit lines $BL_0$, $\overline{BL}_0$, $BL_1$, $\overline{BL}_1$, ..., $BL_{127}$, and $\overline{BL}_{127}$ are precharged to a potential $V_{CC}$. Next, during the selecting mode, operation clock generator $CK_1$ supplies a clock signal $\phi_{WL}$ through on-state transfer gates $TG_0$ and $TG_{128}$ to a word line $WL_0$ and a dummy word line $DWL_2$, which means that the word line $WL_0$ and the dummy word line $DWL_2$ are selected. As a result, for example, when the potential of capacitor $C_m$ of the memory cell $C_{00}$ is high (which corresponds to data "1", for example), the potential of the bit line $BL_0$ does not decrease while when the potential of the capacitor $C_m$ of the memory cell $C_{00}$ is low (which corresponds to data "0"), the potential bit line $BL_0$ decreases. On the other hand, in the dummy cell $DC_{20}$, since capacitor $C_d$ is charged, bit line $BL_0$ decreases. In any case, since the capacitance of the capacitor $C_m$ is different from that of the capacitor $C_d$, there is generated a difference in potential between bit lines $BL_0$ and $\overline{BL}_0$. Such difference in potential is sensed, that is, enlarged, by the sense amplifier $S_0$, and the difference is then read out.

In FIG. 2, however, the load of operation clock generator $CK_1$ is dependent on not only the capacity of the word line $WL_0$, the capacity of the gates of the transistors $Q_m$ of the memory cells $C_{00}$, $C_{01}$, ..., and $C_{0,127}$, and the like, but also is dependent upon the capacity of the dummy word line $DWL_2$, the capacity of the gates of the dummy cells $DC_{20}$, $DC_{21}$, ..., $DC_{2,127}$, and the like. Therefore, the load of the operation clock generator $CK_1$ is large, so that the operation speed of the device is reduced.

Figure 3:
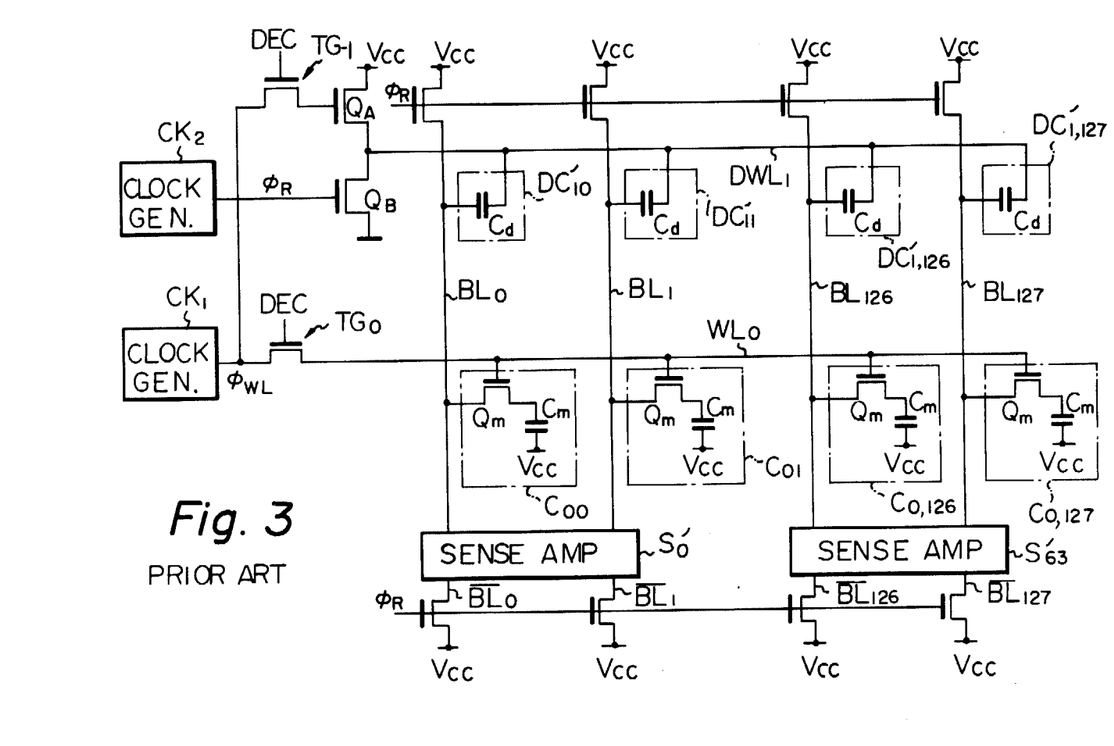
FIG. 3 is a circuit diagram of another prior art dynamic RAM device.

FIG. 3 is a circuit diagram illustrating another prior art dynamic RAM device which is disclosed in FIG. 8 of the IEEE Journal of Solid-State Circuits, vol. SC-15, No. 2, pp. 184-189, April 1980. In FIG. 3, word lines $WL_0$ and dummy word line $DWL_1$ are illustrated in detail while the other word lines and dummy word line $DWL_2$ are omitted. That is, if word line $WL_0$ is selected, dummy word line $DWL_1$ on the same side regarding sense amplifiers $S_0'$, $S_1'$, $S_2'$, ..., and $S_{63}'$ is always selected.

Each of dummy cells $DC_{10}'$, $DC_{11}'$, ..., and $DC_{1,127}'$ comprises only one capacitor $C_d$, thereby remarkably reducing the area occupied by the dummy cells in the chip as compared with the dummy memory cells of FIG. 2. $Q_A$ and $Q_B$ are charging and discharging transistors, respectively, for dummy word line $DWL_1$, that is, for capacitors $C_d$. Charging transistor $Q_A$ is clocked by the clock signal $\phi_{WL}$ generated by the operation clock generator $CK_1$, while discharging transistor $Q_B$ is clocked by the clock signal $\phi_R$ generated by the reset clock generator $CK_2$. Therefore, the load of the operation clock generator $CK_1$ is dependent on the capacity of the charging transistor $Q_A$ in addition to the capacity of the word line $WL_0$, the capacity of the gates of transistors $Q_m$ of the memory cells $C_{00}$, $C_{01}$, ..., and $C_{0,127}$, and the like, thereby reducing the load of the operation clock generator $CK_1$.

Figure 4A:
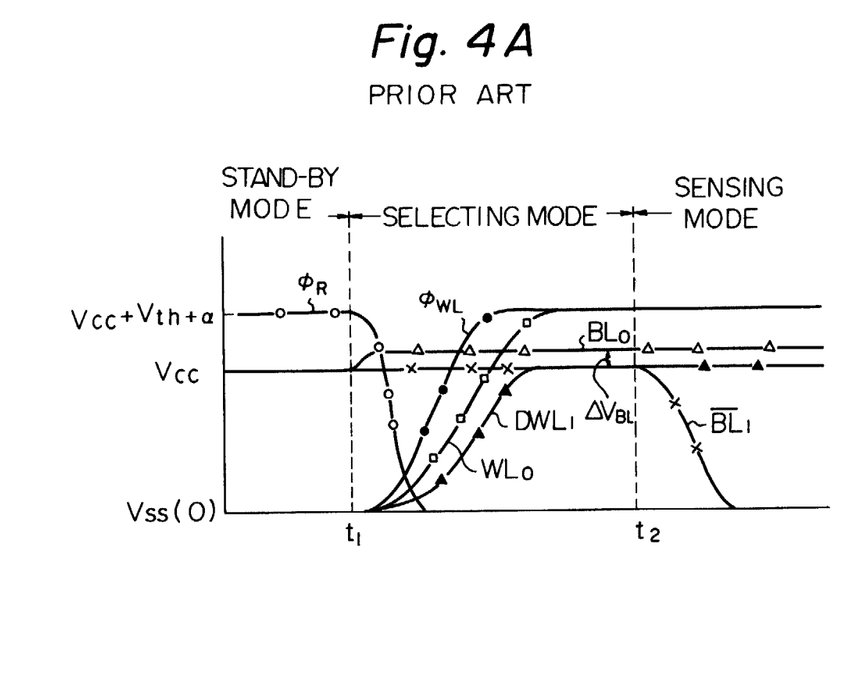
FIGS. 4A and 4B are timing diagrams of the signals appearing in the circuit of FIG. 3.

The operation of the circuit of FIG. 3 will now be explained with reference to FIG. 4A regarding only bit lines $BL_0$ and $\overline{BL}_1$ since the sense amplifier $S_0'$ responds to the pair of bit lines $BL_0$ and $\overline{BL}_1$. Assuming memory cell $C_{00}$ stores data "1", that is, that the capacitor $C_m$ of memory cell $C_{00}$ is charged, during the standby mode, the reset clock signal is high ($V_{CC}+V_{th}+\alpha$), discharging transistor $Q_B$ is turned on so that the capacitors $C_d$ of the dummy cells $DC_{10}'$, $DC_{11}'$, ..., $DC_{1,126}'$, and $DC_{1,127}'$ are discharged, and, accordingly, the potential of the dummy word line $DWL_1$ remains low ($V_{SS}$=ground level). Simultaneously, bit lines $BL_0$, $\overline{BL}_0$, $BL_1$, $\overline{BL}_1$, ..., $BL_{126}$, $\overline{BL}_{126}$, $BL_{127}$, and $\overline{BL}_{127}$ are precharged to level $V_{CC}$. Next, during the selecting mode, the potential of clock signal $\phi_R$ is changed from the level $V_{CC}+V_{th}+\alpha$ to the level $V_{SS}$, and, in addition, the potential of the clock signal $\phi_{WL}$ is changed from the level $V_{SS}$ to the level $V_{CC}+V_{th}+\alpha$. As a result, the potential of the word line $WL_0$ selected by the decoder DEC is changed in common phase with the potential of the clock signal $\phi_{WL}$. In addition, discharging transistor $Q_B$ is turned off while charging transistor $Q_A$ is turned on. As a result, the potential of the selected dummy word line $DWL_1$ is changed in common phase with the potential of the clock signal $\phi_{WL}$. Simultaneously, the bit lines assume a floating state. In this case, since bit line $BL_0$ is connected to dummy word line $DWL_1$ by the capacitive coupling of capacitors $C_d$, the potential of the bit line $BL_0$ is pulled up in proportion to the capacitance ratio of the bit line $BL_0$ to the dummy word line $DWL_1$. That is, the potential of dummy word line $DWL_1$ causes the potential of bit line $BL_0$ to be slightly positive relative to the potential of bit line $\overline{BL}_1$. Thus, a difference $\Delta V_{BL}$ in potential is generated between bit lines $BL_0$ and $\overline{BL}_1$, and, during the sensing mode, such difference is sensed by sense amplifier $S_0'$. As a result, the lower-side potential of bit line $\overline{BL}_1$ is decreased to $V_{SS}$.

Figure 4B:
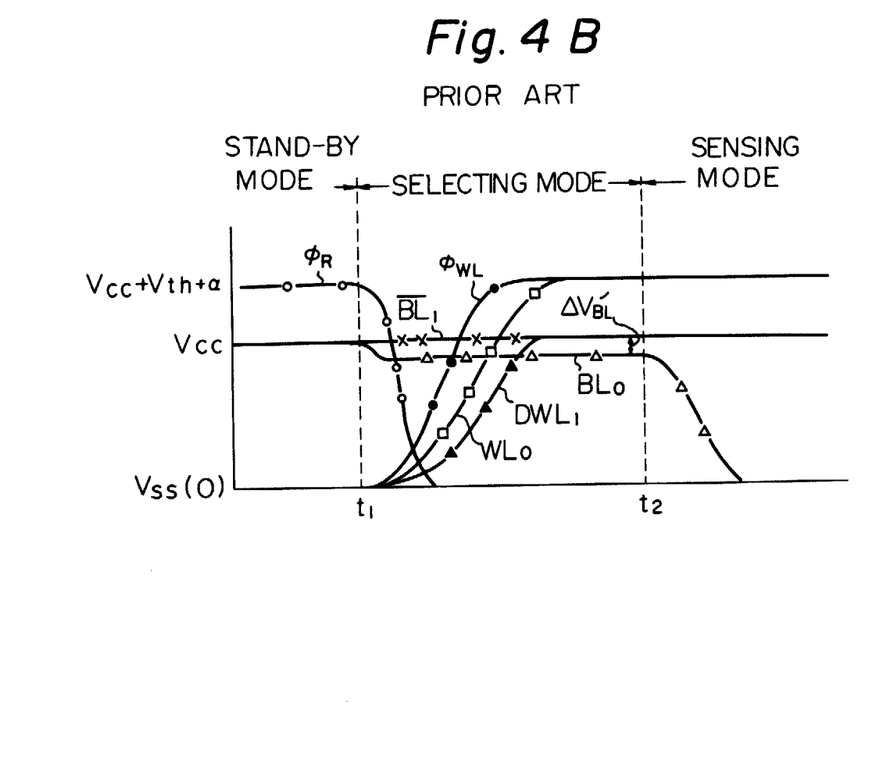

Similarly, assuming that the memory cell $C_{00}$ stores data "0", that is, that capacitor $C_m$ of the memory cell $C_{00}$ is discharged, the potential of dummy word line $DWL_1$ also causes the potential of bit line $BL_0$ to be high. However, current flows from the bit line $BL_0$ into the capacitor $C_m$ of the memory cell $C_{00}$, and, accordingly, the potential of the bit line $BL_0$ is pulled down in proportion to the capacitance ratio of the capacitor $C_m$ of the memory cell $C_{00}$ to the bit line $BL_0$. Then, as illustrated in FIG. 4B, the potential of the bit line $BL_0$ becomes slightly negative relative to the potential of bit line $\overline{BL}_1$. Thus, a difference $\Delta V_{BL}'$ in potential is generated between bit lines $BL_0$ and $\overline{BL}_1$, and, during the sensing mode, such difference $\Delta V_{BL}'$ in potential is sensed by the sense amplifier $S_0'$. As a result, the lower-side potential of bit line $BL_0$ is decreased to $V_{SS}$.

In the dynamic RAM device of FIG. 3, however, in order to push up the potential of the dummy word line $DWL_1$ to the level $V_{CC}$, the operation clock generator $CK_1$ must generate a potential higher than $V_{CC}+V_{th}$, that is, a potential of $V_{CC}+V_{th}+\alpha$, and, the accordingly, operation clock generator $CK_1$ must incorporate a charge-pumping circuit or a bootstrap circuit each of which is not provided with the capability of quickly driving a heavy load including both the dummy word line $DWL_1$ and the word line $WL_0$. Therefore, the operation speed of row selection, that is, the access speed of the device, becomes low.

Figure 5:
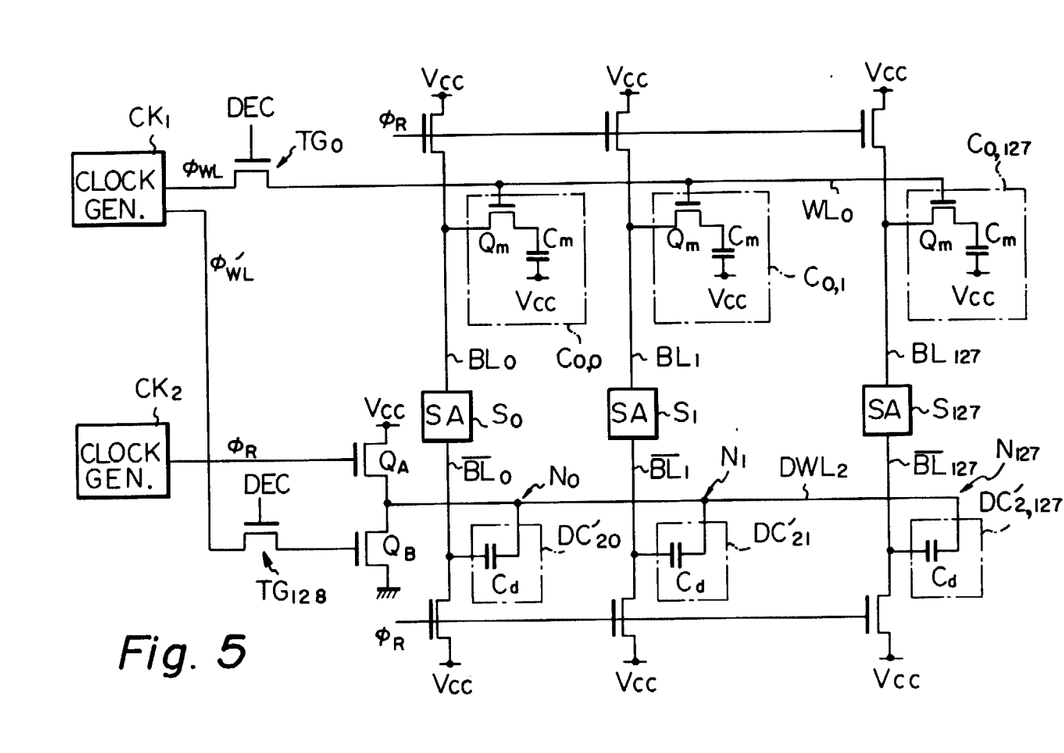
FIG. 5 is a circuit diagram of a first embodiment of the dynamic RAM device according to the present invention.

FIG. 5 is a circuit diagram of a first embodiment of the dynamic RAM device according to the present invention. In FIG. 5 the elements which are the same as those of FIG. 3 are denoted by the same reference numerals as in FIG. 3. As the figure shows, if word line $WL_0$ is selected, dummy word line $DWL_2$ on the opposite side regarding the sense amplifiers $S_0, S_1, \ldots,$ and $S_{127}$ is selected. In addition, the charging transistor $Q_A$ is connected to the reset clock generating circuit $CK_2$ while the discharging transistor $Q_B$ is connected through transfer gate $TG_{128}$ to the operation clock signal generating circuit $CK_1$ which generates clock pulses $\phi_{WL}$ and $\phi_{WL}'$ in reciprocal phase with the reset pulse $\phi_R$.

The operation of the circuit of FIG. 5 regarding only bit lines $BL_0$ and $\overline{BL}_0$ will now be explained with reference to FIG. 6A. Assuming that memory cell $C_{00}$ stores data "1", that is, that capacitor $C_m$ of memory cell $C_{00}$ is charged, during the standby mode, the reset clock signal $\phi_R$ is high ($V_{CC}+V_{th}+\alpha$), charging transistor $Q_A$ is turned on so that capacitors $C_d$ of dummy cells $DC_{20}'$, $DC_{21}'$, ..., $DC_{2,126}'$, and $DC_{2,127}'$ are charged, and, accordingly, the potential of dummy word line $DWL_2$ remains high ($V_{CC}$). Simultaneously, bit lines $BL_0$, $\overline{BL}_0$, $BL_1$, $\overline{BL}_1$, ..., $BL_{126}$, $\overline{BL}_{126}$, $BL_{127}$, and $\overline{BL}_{127}$ are precharged to level $V_{CC}$. Next, during the selecting mode, the potential of clock signal $\phi_R$ is changed from the level $V_{CC}+V_{th}+\alpha$ to the level $V_{SS}$, however, the potential of clock signal $\phi_{WL}$ is changed from the level $V_{SS}$ to the level $V_{CC}+V_{th}+\alpha$. As a result, the potential of a selected word line $WL_0$ is changed in response to the potential of the clock signal $\phi_{WL}$. When clock signal $\phi_{WL}$ is changed, clock generator $CK_1$ simultaneously generates the clock signal $\phi_{WL}'$ which is changed from $V_{SS}$ to $V_{CC}$ in common phase with the clock signal $\phi_{WL}$. Thus, charging transistor $Q_A$ is turned off while discharging transistor $Q_B$ is turned on. As a result, the potential of dummy word line $DWL_2$ is changed in opposite phase to the potential of clock signal $\phi_{WL}'$. Simultaneously, the bit lines assume a floating state. In this case, since bit line $\overline{BL}_0$ is connected to dummy word line $DWL_2$ by the capacitive coupling of capacitors $C_d$, the potential of bit line $\overline{BL}_0$ is pulled down by an amount in proportion to the capacitance ratio of dummy cell capacitor $C_d$ to bit line $\overline{BL}_0$. That is, the potential of dummy word line $DWL_2$ pulls down the potential of bit line $\overline{BL}_0$ so that it is slightly negative relative to the potential of bit line $BL_0$. Thus, a difference $\Delta V_{BL}$ in potential is generated between bit lines $BL_0$ and $\overline{BL}_0$, and, during the sensing mode, such difference is sensed by sense amplifier $S_0$. As a result, the lower-side potential of bit line $\overline{BL}_0$ is decreased to $V_{SS}$.

Similarly, assuming that memory cell $C_{00}$ stores data "0", that is, the capacitor $C_m$ of memory cell $C_{00}$ is discharged and the potential of dummy word line $DWL_2$ also pulls down the potential of bit line $\overline{BL}_0$. However, current flows from bit line $BL_0$ into capacitor $C_m$ of memory cell $C_{00}$ and, accordingly, the potential of bit line $BL_0$ is also pulled down by the capacity ratio of capacitor $C_m$ of memory cell $C_{00}$ to bit line $BL_0$. Dummy cell capacitor $C_d$ is designed to have about half of the capacitance of one memory cell capacitor $C_m$. Then, as illustrated in FIG. 6B, the potential of bit line $BL_0$ becomes slightly negative relative to the potential of bit line $\overline{BL}_0$. Thus, a difference in potential $\Delta V_{BL}'$ is generated between bit lines $BL_0$ and $\overline{BL}_0$, and, during the sensing mode, such difference in potential is sensed by sense amplifier $S_0$. As a result, the lower-side potential of bit line $BL_0$ is decreased to $V_{SS}$.

In the dynamic RAM device of FIG. 5, operation clock generator $CK_1$ generates clock signals $\phi_{WL}$ having level $V_{CC}+V_{th}+\alpha$ and $\phi_{WL}'$ having level $V_{CC}$. However, it should be noted that the load driven by the clock signal $\phi_{WL}$ which requires a high level $V_{CC}+V_{th}+\alpha$ is reduced. As stated above, a clock signal having a level higher than $V_{CC}$ is generated by a charge-pumping circuit, bootstrap circuit, or the like which usually has only an ability to drive a small load. Therefore, if the load which requires a clock signal having a level higher than $V_{CC}$ is small, the operation speed of the operation clock generator $CK_1$ becomes high. As a result, the access speed of the device becomes high.

Note that generally in a memory device, the highest priority of design is to reduce the access time. Therefore, although reset clock generator $CK_2$ incorporates a charge-pumping circuit or a bootstrap circuit for generating a potential higher than $V_{CC}$, this is not disadvantageous since the reset operation does not affect the access speed.

Figure 7:
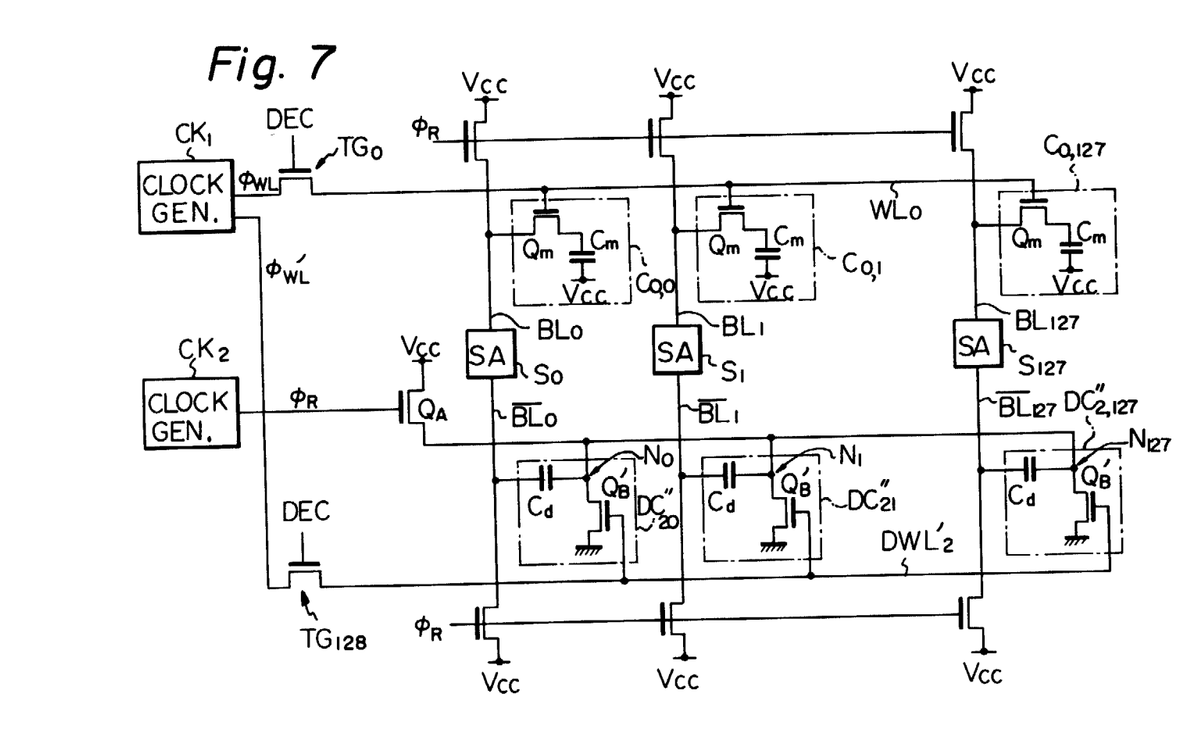
FIG. 7 is a circuit diagram of a second embodiment of the dynamic RAM device according to the present invention.

FIG. 7 is a circuit diagram of a second embodiment of the dynamic RAM according to the present invention. In FIG. 7, each of dummy cells $DC_{20}'''$, $DC_{21}'''$, . . . , and $DC_{2,127}'''$ comprises a discharging transistor $Q_B'$, for discharging capacitor $C_d$, instead of the discharging transistor $Q_B$ of FIG. 5. In this case, discharging transistors $Q_B'$ are smaller than discharging transistor $Q_B$ of FIG. 5. However, the operation of the circuit of FIG. 7 is substantially the same as that of the circuit of FIG. 5. Note that, in this case, dummy word line $DWL_2'$ is not directly connected to capacitors $C_d$ of dummy cells $DC_{20}''$, $DC_{21}''$, . . . , and $DC_{2,127}''$. In addition, the potential at node $N_0$, $N_1$, . . . , or $N_{127}$ of FIG. 7 corresponds to the potential of dummy word line $DWL_2$ of FIG. 5.

Figure 8A:
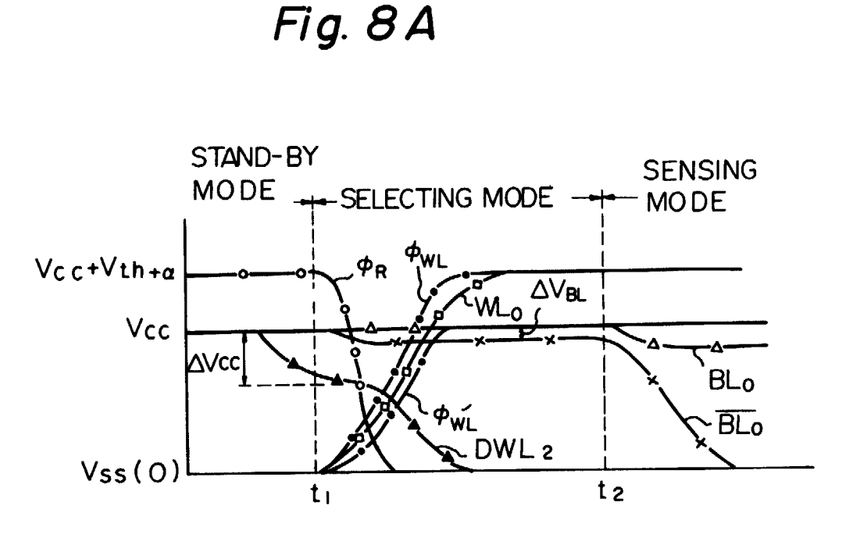
FIGS. 8A and 8B are also timing diagrams of the signals appearing in the circuit of FIG. 5.
Figure 8B:
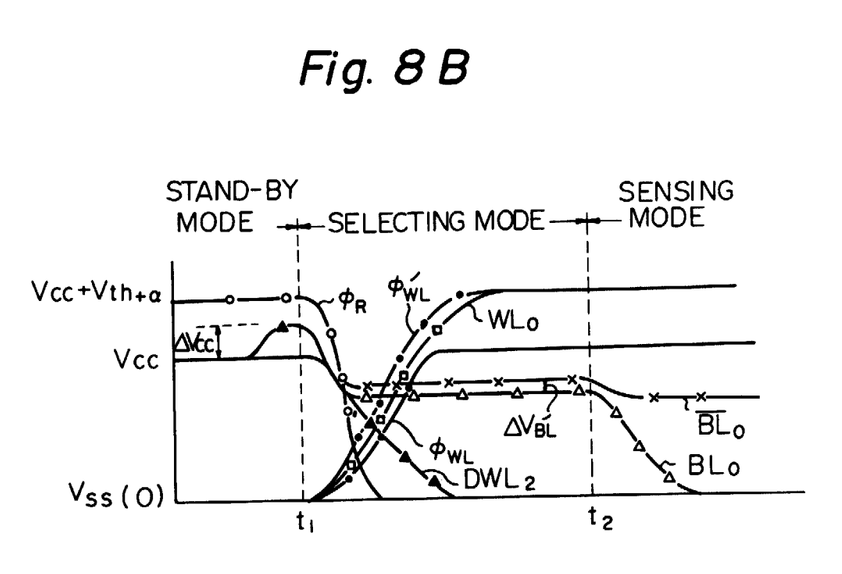

FIGS. 8A and 8B are also timing diagrams of the signals appearing in the circuit of FIG. 5 (or 7). In FIGS. 8A and 8B, it is assumed that the potential of the power supply $V_{CC}$ fluctuates at the transition from the standby mode to the selecting mode. That is, since charging transistor $Q_A$ is relatively large, the potential of dummy word line $DWL_2$ rapidly follows the fluctuation of the power supply potential $V_{CC}$. However, since the bit lines have a large capacitance and, in addition, the precharging transistors are relatively small so as to limit current therethrough, the potential of the bit lines responds very slowly to fluctuation of the power supply voltage $V_{CC}$.

Figure 6A:
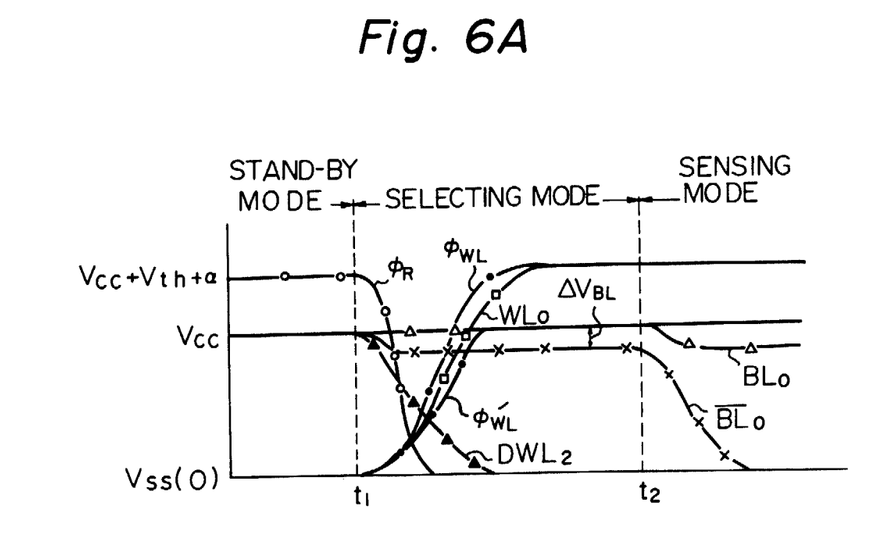
FIGS. 6A and 6B are timing diagrams of the signals appearing in the circuit of FIG. 5.
Figure 6B:
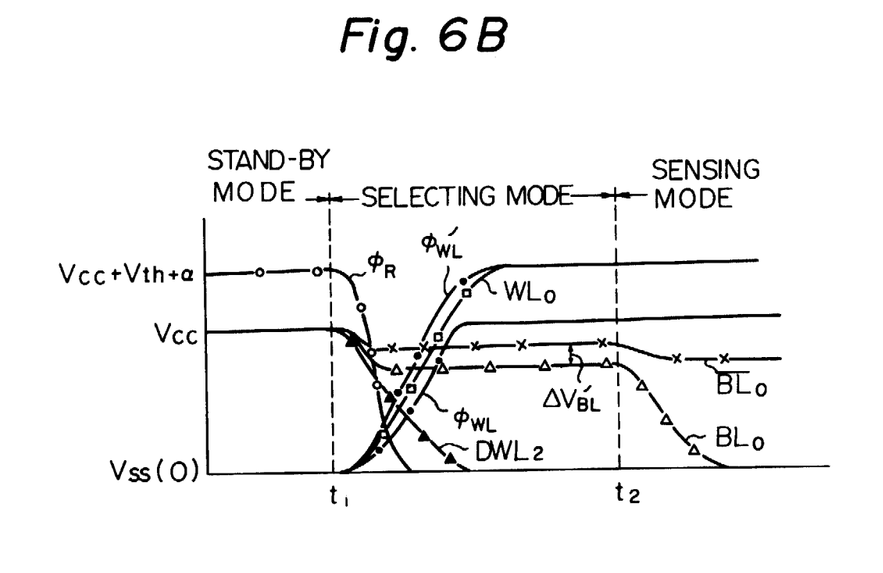

In FIG. 8A, which corresponds to FIG. 6A, the power supply potential is decreased from $V_{CC}$ to $V_{CC} - \Delta V_{CC}$. In this case, the potential of bit line $\overline{BL_0}$ is not as decreased as in FIG. 6A. That is, in the case of reading data "1", the difference $\Delta V_{BL}$ in potential becomes small. Consequently, the sensing speed is reduced, and an erroneous read operation may result. However, in FIG. 8B, which corresponds to FIG. 6B, the power supply potential is increased from $V_{CC}$ to $V_{CC} + \Delta V_{CC}$. In this case, the potential of bit line $\overline{BL_0}$ is decreased greatly as compared with FIG. 6B. That is, in the case of reading data "0", the difference $\Delta V_{BL}'$ in potential also becomes small. Consequently, the sensing speed is reduced, and an erroneous read operation may result.

In order to avoid fluctuation of the potential of the bit lines due to fluctuation of a power supply potential, according to the present invention, capacitor $C_d$ of the dummy cell can also be charged by using the potential of the corresponding bit line.

Figure 9:
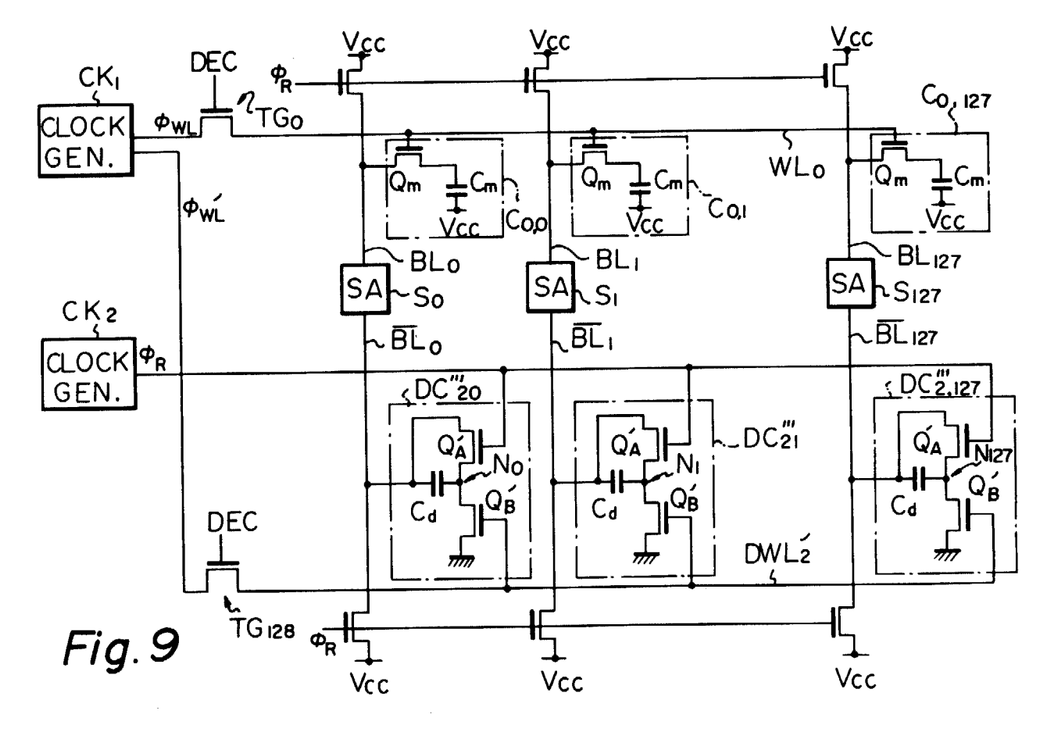
FIG. 9 is a circuit diagram of a third embodiment of the dynamic RAM device according to the present invention.

FIG. 9 is a circuit diagram of a third embodiment of the dynamic RAM device according to the present invention. In FIG. 9, each of dummy cells $DC_{20}'''$, $DC_{21}'''$, . . . , and $DC_{2,127}'''$ comprises a charging transistor $Q_A'$ instead of charging transistor $Q_A$ of the FIG. 7. That is, charging transistor $Q_A'$ of dummy cell $DC_{20}'''$ is connected between bit line $\overline{BL_0}$ and node $N_0$. Therefore, during the standby mode, even when power supply potential $V_{CC}$ fluctuates rapidly, the potential at node $N_0$, $N_1$, . . . , or $N_{127}$ of capacitors $C_d$ remains stable since the potential at node $N_0$, $N_1$, . . . , or $N_{127}$ follows the potential of bit line $\overline{BL_0}$, $\overline{BL_1}$, . . . , or $E,ovs/BL/_{127}$, which potential does not fluctuate as much. Therefore, the above-mentioned unfavorable difference in potential, which reduces the sensing speed and may result in an erroneous read operation is not generated.

As explained hereinbefore, the dynamic RAM device according to the present invention is advantageous, as compared with the prior art as illustrated in FIG. 3, in that the access speed is high since it is unnecessary that the operation clock generator $CK_1$ drive a heavy load requiring a potential higher than $V_{CC}$ during the selecting operation.

We claim:

1. A dynamic random access memory device, comprising:
   first and second power supplies, the potential of said first power supply being lower than that of said second power supply;
   a first clock generator, operatively connected to said second power supply, for generating a first clock signal having a potential higher than the potential of the second power supply and a second clock signal having a potential lower than or equal to the potential of said second power supply;
   a second clock generator, operatively connected to said second power supply, for generating a third clock signal having a potential higher than the potential of said second power supply, said third clock signal generated alternately with said first and second clock signals;
   a plurality of word lines, operatively connected to said first clock generator, selectively driven by said first clock signal;
   a plurality of pairs of bit lines, intersecting said word lines, each said pair of bit lines operatively connected to said second clock generator and precharged by said second power supply in response to said third clock signal;
   a plurality of sense amplifiers, respectively, operatively connected between said pairs of bit lines, for sensing the difference in potential between each of said pairs of bit lines;
   a plurality of one-transistor, one-capacitor-type memory cells, respectively, operatively connected at said intersections of said word lines and said bit lines;
   a plurality of dummy cells, respectively, operatively connected to each of said bit lines, each of said dummy cells comprising:
      a capacitor having a first electrode connected to one of said bit lines and a second electrode; and
      a connection node located between said second electrode of said capacitor and said second clock generator;
   at least one charging means, each said at least one charging means operatively connected to said connection nodes of said dummy cells, respectively, and operatively connected to said second clock generator, for charging said capacitor of each of said dummy cells upon receipt of said third clock signal; and
   at least one discharging means, each discharging means operatively connected to said connection nodes of said dummy cells, respectively, and operatively connected to said first clock generator, for discharging said capacitor of each of said dummy cells upon receipt of said second clock signal.

2. A device as set forth in claim 1, wherein each said discharging means comprises a transistor having a drain operatively connected to said connection nodes of said dummy cells, having a gate, operatively connected to said first clock generator, for receiving said second clock signal, and having a source operatively connected to said first power supply.

3. A device as set forth in claim 1, wherein each said discharging means comprises a transistor, included in each of said dummy cells, having a drain operatively connected to said connection node of a respective one of said dummy cells having a gate operatively connected to said first clock generator, for receiving said second clock signal, and having a source operatively connected to said first power supply.

4. A device as set forth in claim 1, wherein each said charging means comprises a transistor having a drain operatively connected to said second power supply, having a gate operatively connected to said second clock generator for receiving said third clock signal, and having a source operatively connected to said connection nodes of said dummy cells.

5. A device as set forth in claim 1, wherein each said charging means comprises a transistor, included in each of said dummy cells, having a drain operatively connected to a respective bit line, having a gate operatively connected to said second clock generator for receiving said third clock signal, and having a source operatively connected to said connection node of a respective one of said dummy cells.

6. A dynamic random access memory device, operatively connected to first and second power supplies, the first potential of the first power supply begin less than the second potential of the second power supply, comprising:
  a first clock generator, operatively connected to the second power supply, for generating a first clock signal having a third potential greater than the second potential of the second power supply, and a second clock signal having a fourth potential less than or equal to the second potential of the second power supply;
  a second clock generator, operatively connected to the second power supply, for generating a third clock signal having a fifth potential greater than the second potential of the second power supply, the third clock signal generated alternately with the first and second clock signals;
  word lines, operatively connected to said first clock generator, selectively driven by the firt clock signal;
  pairs of bit lines intersecting said word lines and operatively connected to said second clock generator, each of said pairs of bit lines having a potential and being precharged by the second power supply in response to the third clock signal;
  sense amplifiers, respectively, operatively connected between said pairs of bit lines, for sensing the difference in potential between said pairs of bit lines;
  one-transistor, one-capacitor-type memory cells, respectively, operatively connected at said intersections of said word lines and said bit lines;
  dummy cells, respectively, operatively connected to each of and said bit lines, each of said dummy cells comprising:
    a capacitor having a first electrode operatively connected to one of said bit lines and having a second electrode; and
    a connection node located between said second electrode of said capacitor and said second clock generator;
  charging means, operatively connected to each of said connection nodes and connected to said second clock generator, for receiving the third clock signal and for charging said capacitor of each of said dummy cells; and
  discharging means, operatively connected to each of said connection nodes of said dummy cells and connected to said second clock generator, for receiving the third clock signal and for discharging said capacitor of each of said dummy cells.

7. A dynamic random access memory device as set forth in claim 6, wherein said discharging means comprises a transistor having a drain, respectively, operatively connected to said connection nodes, having a gate operatively connected to said first clock generator for receiving the second clock signal, and having a source operatively connected to the first power supply.

8. A dynamic random access memory device as set forth in claim 6, wherein said discharging means comprises a transistor included in each of said dummy cells, said transistor having a drain, respectively, operatively connected to said connection node of said dummy cells, having a gate operatively connected to said first clock generator for receiving the second clock signal, and having a source operatively connected to the first power supply.

9. A dynamic random access memory device as set forth in claim 6, wherein said charging means comprises a transistor having a drain operatively connected to the second power supply, having a gate operatively connected to said second clock generator for receiving the third clock signal, and having a source, respectively, operatively connected to said connection node of said dummy cells.

10. A dynamic random access memory device as set forth in claim 6, wherein said charging means comprises a transistor included in each of said dummy cells, having a drain operatively connected to one of said bit lines, having a gate operatively connected to said second clock generator for receiving the third clock signal, and having a source, respectively, operatively connected to said connection node of said dummy cells.

11. A device as set forth in claim 6, wherein said discharging means comprises a transistor included in each of said dummy cells, having a drain, respectively, operatively connected to said connection node of said dummy cells, having a gate operatively connected to said first clock generator for receiving the second clock signal, and having a source operatively connected to the second power supply.

12. A device as set forth in claim 7, wherein said charging means comprises a transistor having a drain operatively connected to the second power supply, having a gate operatively connected to said second clock generator for receiving the third clock signal, and having a source, respectively, operatively connected to said connection node of said dummy cells.

* * * * *

UNITED STATES PATENT AND TRADEMARK OFFICE
CERTIFICATE OF CORRECTION

PATENT NO. : 4,484,312

DATED : NOVEMBER 20, 1984

INVENTOR(S) : TOMIO NAKANO ET AL.

It is certified that error appears in the above-identified patent and that said Letters Patent is hereby corrected as shown below:

FRONT PAGE, [57] ABSTRACT
line 4, delete the large space between "$DC_{2,127}$'," and "$DC_{20}$".

Col. 3, line 27, "E,ovs/Bl/ $_1$, ..." should be --$\overline{BL}_1$, ...,--;

line 28, ", $BL_{127}$" should be --$BL_{127}$--;

line 38, "$TH_{128}$" should be --$TG_{128}$--.

Col. 4, line 33, "lines" should be --line--.

Col. 7, line 64, "$N_O$" should be --$N_0$--.

Col. 8, line 1, "E,ovs/BL/ $_{127}$," should be --$\overline{BL}_{127}$;--.

Col. 9, line 35, "begin" should be --being--.

Col. 10, line 2, delete "and".

Signed and Sealed this

Seventh Day of May 1985

[SEAL]

Attest:

DONALD J. QUIGG

Attesting Officer     Acting Commissioner of Patents and Trademarks